April 22, 1958 G. RAISBECK 2,832,051

PUSH-PULL TRANSISTOR MODULATOR

Filed June 1, 1953 2 Sheets-Sheet 1

INVENTOR
G. RAISBECK
BY Hugh S. Wertz
ATTORNEY

April 22, 1958 G. RAISBECK 2,832,051

PUSH-PULL TRANSISTOR MODULATOR

Filed June 1, 1953 2 Sheets-Sheet 2

INVENTOR
G. RAISBECK
BY Hugh S. Wertz
ATTORNEY

United States Patent Office 2,832,051

Patented Apr. 22, 1958

2,832,051

PUSH-PULL TRANSISTOR MODULATOR

Gordon Raisbeck, Basking Ridge, N. J., assignor to Bell Telephone Laboratories, Incorporated, New York, N. Y., a corporation of New York Application June 1, 1953, Serial No. 358,801

5 Claims. (Cl. 332—37)

This invention relates to transistor circuits and more specifically to transistor modulator circuits.

In any modulator, the relation between input signals and the output signal must be non-linear. In general, a non-linear circuit produces undesired frequencies in the output as well as the desired modulation products. In a modulator for creating amplitude-modulated carrier waves, the harmonics of the carrier frequency usually appear in the output. These harmonics are among the most objectionable of the unwanted frequencies because they are continuous and relatively large in amplitude.

Accordingly, an important object of the present invention is to reduce the harmonics of the carrier frequency in the output of modulators to a negligible amplitude.

A collateral object is to greatly reduce the power consumption of modulators, and to increase their electrical efficiency.

A non-linear device commonly used to generate modulation products is an amplifier biased for class AB, B or C operation, which is to say that during each cycle of carrier signal input the amplifier is cut off for less than half, substantially half, or more than half, respectively, of the cycle. Modulation is effected by varying the bias of the input circuit with a modulation signal. This regulates the length of the portion of the cycle of the carrier wave input during which the amplifier is cut off. Such an amplifier normally generates harmonics of the carrier of all orders. In push-pull vacuum tube modulators of the prior art, however, it has been determined that even numbered harmonics of the carrier frequency are substantially eliminated.

In accordance with the present invention, it has been determined that the odd as well as the even harmonic content of a modulator is greatly reduced when the carrier signal input level and the biasing circuits of a push-pull transistor modulator are proportioned so that the transistors are operated class B. The modulator circuit in accordance with the invention has overcome the biasing difficulties inherent in obtaining class B operation in a transistor modulator and thus has attained low distortion concurrently with remarkably low power dissipation. By way of example, the specific modulation circuit shown in the drawings includes two transistors arranged in a grounded emitter type push-pull circuit in which the emitter-to-base circuits are biased both by a voltage source and biasing resistors, and in which the input carrier signal is adjusted to the level required for class B operation of the transistors.

Additional objects and certain advantages and features of the invention will become apparent in the course of the detailed description of the drawings. In the drawings.

Figure 1:
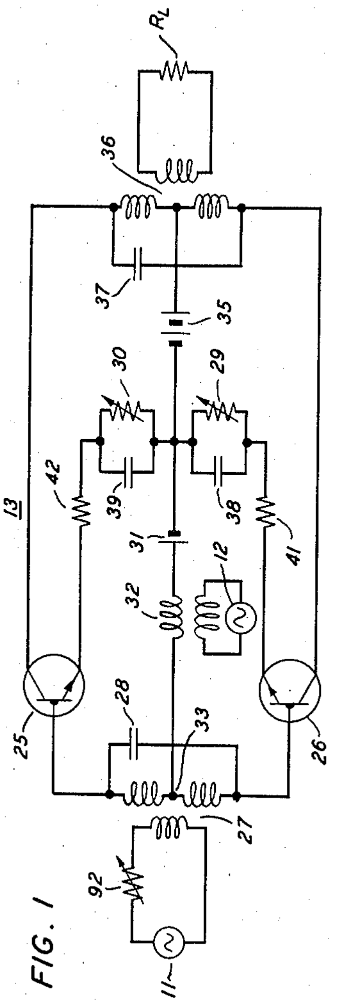
Fig. 1 is a circuit diagram of the modulator in accordance with the invention.

Referring more particularly to the drawings, Fig. 1 shows by way of example and for purposes of illustration a push-pull transistor modulator in accordance with the invention. The modulator includes two transistors 25 and 26 in a push-pull common emitter circuital arrangement. The carrier source is coupled to the modulator through the variable resistance 92, and the transformer 27 which has a tuned secondary including the capacitor 28. In accordance with the invention, the biasing circuits for the two transistors are unusual inasmuch as they include both the self-biasing resistances 29 and 30 and the bias voltage source 31. The modulation signal source 12 is coupled through the transformer 32 to the modulator at a point between the common biasing source 31 and the center tap 33 of the transformer 27. The collector biasing source 35 is coupled to the common point between the emitter biasing resistances 29 and 30 and the output transformer 36 and then in parallel to the collectors of the two transistors. Although the primary of the output transformer, like the secondary of the input transformer, is shown tuned to resonance (by the capacitor 37), the harmonic content of the modulator is so low that in some cases it may be considered desirable to operate the modulator without tuning. The biasing resistors 29 and 30 are bypassed by the condensers 38 and 39 for high frequencies, but the resistances 41 and 42 are provided to give some degenerative feedback at these higher frequencies.

Figure 2:
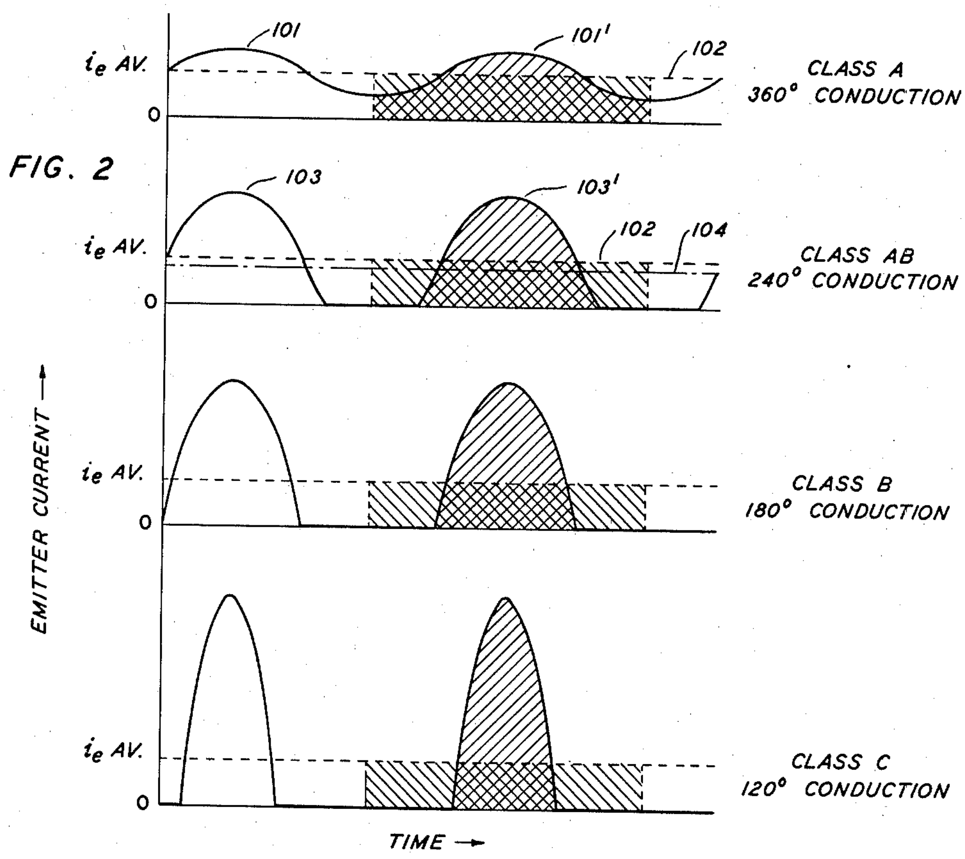
Figure 2 is a plot of the emitter current of one of the transistors in the modulator under various conditions of carrier input level.

In the operation of the modulator, the magnitude of the emitter-to-base biasing potential 31 fixes the average emitter voltage, and this in turn fixes the average emitter current. This average emitter current is shown by a horizontal dotted line in each of the four plots of Fig. 2. Referring to Fig. 2 in detail, the four plots indicate emitter current versus time for one transistor as successively increasing levels of carrier input are applied to the input of the modulator. In order for the average emitter current to remain fixed, note that the carrier base line is depressed as the carrier amplitude increases. A physical picture of these relationships may be secured by noting that the oppositely sectioned areas of each of the four plots of Fig. 2 must be of equal area. According to this criterion note that the base line of the carrier plot 101 is coincident with horizontal line 102 representing average emitter current in the first plot of Fig. 2 illustrating class A operation. In class AB operation as illustrated in the second plot of Fig. 2, emitter current only flows for 240 degrees of each 360 degree cycle, the current peaks 103 must be higher to compensate for the off period, and the carrier base line 104 is depressed below the average emitter current level 102. Similarly, with class B operation, the carrier base line is depressed so that it is coincident with the 0 line, and with class C operation the carrier base line (not shown) is depressed well below the 0 line.

The location of the carrier base line depends on the relationship between the carrier input level and the biasing resistances as compared to the biasing voltage. Furthermore, it may be readily determined that when the peak value of emitter current divided by $\pi$ (or 3.1416) and multiplied by the biasing resistance is approximately equal to the biasing voltage, the desired class B mode of operation shown in the third plot of Fig. 2 results.

Figure 3:
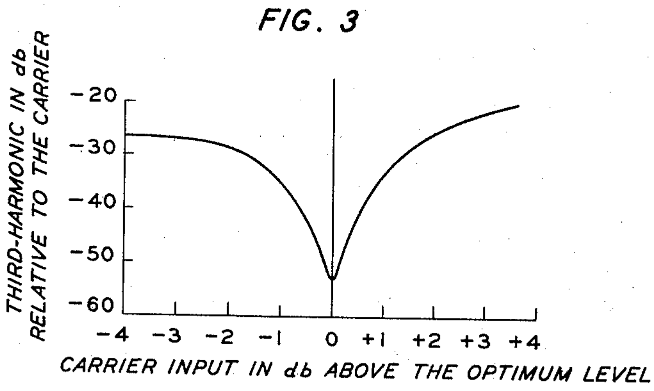
Fig. 3 is a plot of third harmonic distortion as a function of carrier input level.

The plot of Fig. 3 illustrates the third-harmonic distortion in the output of the modulator as the carrier input to the modulator departs from the optimum level for class B operation. The sharp minimum at the proper input level and the rapid rise of distortion at higher and lower input levels is particularly to be noted. While this same effect may be noted to a slight degree at high levels of modulation even with the proper carrier input level, these transient effects are relatively unimportant and do not create the intermodulation problem which a steady high level third harmonic presents.

Figure 4:
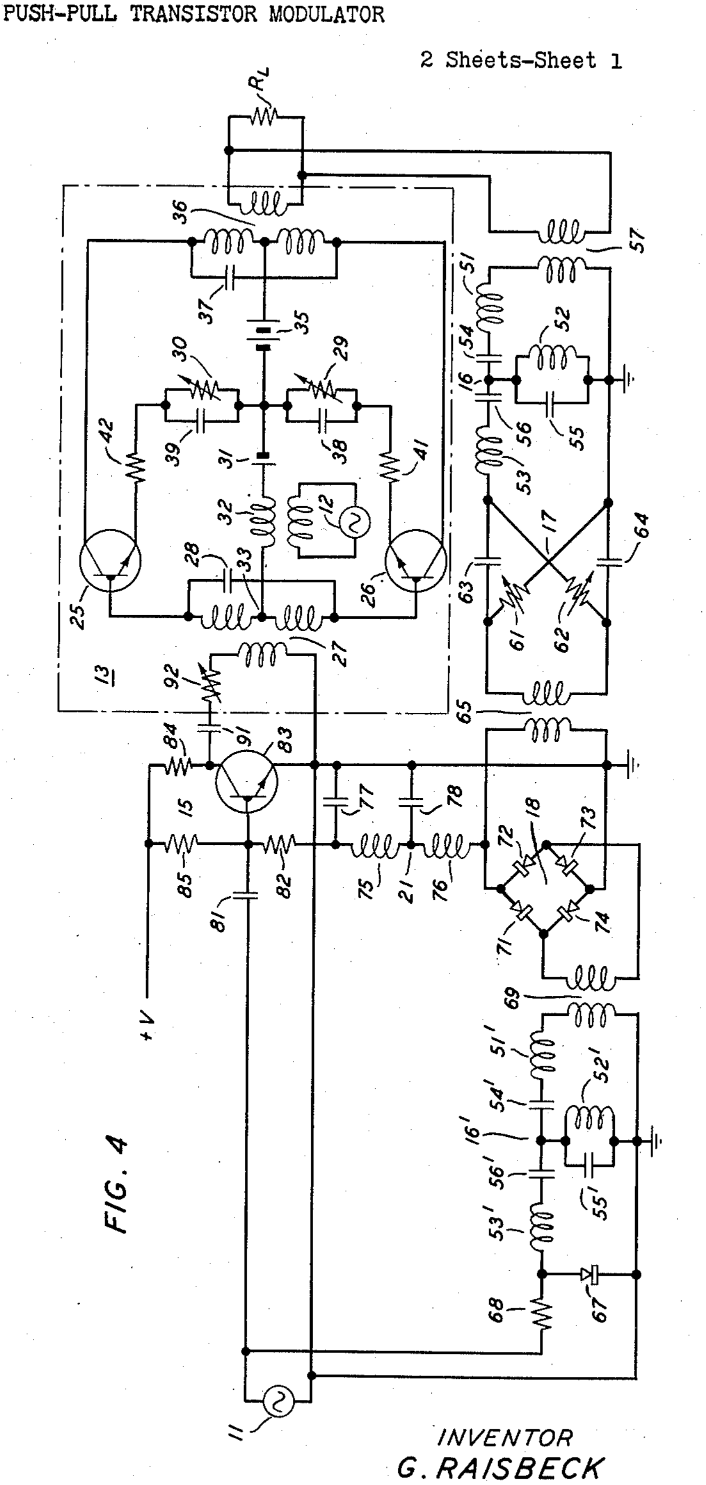
Fig. 4 represents an electrical system including the modulator of Fig. 1 and an associated control circuit.

Fig. 4 represents an electrical system based on the modulator of Fig. 1 and including certain refinements which utilize the principles developed above in the discussion of Figs. 2 and 3. More specifically, it may be noted that the modulator of Fig. 1 is included within the box 13 of Fig. 4 and it will be shown that most of the balance of the circuit of Fig. 4 serves to automatically maintain the carrier input level at the optimum level indicated at "O" in Fig. 3. This corresponds to the desired class B mode of operation at which distortion is minimized.

Reviewing the control circuits of Fig. 4, the output across the load resistance $R_L$ is sampled and is fed back through the third harmonic filter 16, the phase controller 17, is compared with a standard source of harmonic in the mixer 18 and the resulting signal is coupled by the low pass filter 21 to control the variable gain amplifier 15. The standard source of third harmonic is obtained by the use of the diode 67 coupled across the carrier source, and the third harmonic filter 16'. By utilizing the change of phase of the third harmonic output which occurs as the modulator changes from underdriven to overdriven, and comparing this signal with the standard source of third harmonic in the mixer 18, the voltage applied to the amplifier is proportional to the magnitude and phase of the third harmonic output. The variable gain amplifier then controls the carrier input level to the modulator and thus maintains the desired class B mode of operation.

Referring in detail to the control circuits of Fig. 2, the filter unit 16 is made up of a T-section of tuned circuits comprising the inductances 51, 52 and 53 and the capacitances 54, 55 and 56 coupled by the transformer 57 to the output of the modulator. The phase control network comprises the cross-connected variable resistances 61, 62 and the capacitances 63 and 64. This phase control network is coupled to the mixer 18 by means of the transformer 65. As noted above, the third harmonic generator may be a simple rectifying element 67, which may be coupled by the resistance 68 directly to the output of the source of carrier frequency signals. A third harmonic filter 16' similar to that shown at 16 is included to eliminate other frequencies generated by this harmonic generator. This filter is coupled to the mixer by means of the transformer 69. The mixer 18 is a conventional mixer employing four rectifying elements 71, 72, 73 and 74. The output from the mixer is fed through the low pass filter 21 made up of inductances 75 and 76 and capacitances 77 and 78 in order to eliminate all but the direct current components which are generated by the mixer 18. The variable gain amplifier 15 is coupled to the carrier frequency source through the condenser 81. The control voltage from the low pass filter 21 is applied through the resistances 82 to the emitter-to-base biasing circuit of the grounded emitter transistor 83. The collector biasing voltage is applied to the collector of transistor 83 to the resistor 84. Additional biasing for the base to emitter circuit is provided through the resistances 85. The output from the variable gain amplifier 15 is coupled to the modulator 13 by means of the condenser 91 and variable resistance 92.

By way of example but not of limitation, suitable operating conditions for the modulator may be secured when junction transistors are used at 25 and 26, when the base-to-emitter biasing potential is equal to 1.5 volts, resistors 41 and 42 are 200 ohms and resistors 29 and 30 are each equal to 1800 ohms. Under these conditions the average emitter current is about 0.75 milliampere.

It is to be understood that the above-described arrangements are illustrative of the application of the principles of the invention. Numerous other arrangements may be devised by those skilled in the art without departing from the spirit and scope of the invention.

What is claimed is:

1. In a push-pull transistor modulator, two transistors, means for operating said transistors push-pull, means for applying an input carrier signal to the respective inputs of said transistors, means for applying a modulating signal to respective input terminals of said transistors, variable circuital means for regulating the level of the carrier signal applied to said transistors, and control means coupled to the output from said transistors responsive to the magnitude and phase of the third-harmonic distortion content for controlling said variable circuital means and thus minimizing the third-harmonic distortion.

2. In a push-pull transistor modulator, two transistors, means for operating said transistors push-pull, means for applying an input carrier signal to said transistors, means for applying a modulating signal to said transistors; and means for operating said transistor modulator class B where distortion is at a minimum, said last-mentioned means including means for regulating the level of the carrier signal applied to said transistors, control means coupled to the output from said transistors for developing a voltage indicative of the magnitude and phase of the third harmonic distortion content and thereby indicating the direction and magnitude of the departure from class B operation, and means for varying said carrier level regulating means to higher or lower carrier input levels in accordance with said indicating voltage and thus restoring said transistors to class B operation.

3. In combination, a push-pull transistor modulator, means for varying the carrier signal drive to said modulator, means for developing a biasing voltage proportional to the magnitude of the third harmonic of the carrier signal at the output of said modulator and having a polarity dependent on the phase of said third harmonic, and means for applying said biasing voltage to control said carrier drive varying means to maintain class B operation.

4. A push-pull transistor modulator comprising two transistors, means for operating said transistors push-pull, a source of input carrier signals, a variable signal transmission network connected between said source of carrier signals and the respective inputs of said transistors, means for applying a modulating signal to the respective inputs of said transistors, and means responsive to the third harmonic signals at the output of said modulator for regulating said variable signal transmission network to maintain class B operation.

5. A push-pull transistor modulator comprising two transistors, means for operating said transistors push-pull, a source of input carrier signals, a variable signal transmission network connected between said source of carrier signals and the respective inputs of said transistors, means for applying a modulating signal to the respective inputs of said transistors, means coupled to said source of carrier signals for developing a standard third harmonic signal, means for comparing the third harmonic output from said modulator with said standard signal and developing a biasing signal having a magnitude proportional to that of said third harmonic output signal and a polarity dependent on the phase of said third harmonic, and means for applying said biasing signal to control said variable signal transmission network.

References Cited in the file of this patent

UNITED STATES PATENTS

| | | |
|---|---|---|
| 1,636,146 | Mohr | July 19, 1927 |
| 2,267,703 | Henkler | Dec. 23, 1941 |
| 2,387,652 | Dickieson | Oct. 23, 1945 |
| 2,447,701 | Hings | Aug. 24, 1948 |
| 2,533,001 | Eberhard | Dec. 5, 1950 |
| 2,647,957 | Mallinckrodt | Aug. 4, 1953 |
| 2,680,160 | Yaeger | June 1, 1954 |
| 2,691,075 | Schwartz | Oct. 5, 1954 |